United States Patent
Seong et al.

(10) Patent No.: US 8,492,765 B2
(45) Date of Patent: Jul. 23, 2013

(54) DISPLAY DEVICE AND METHOD OF FABRICATING THE SAME

(75) Inventors: Seok-Je Seong, Yongin-si (KR); Jisuk Lim, Cheonan-si (KR)

(73) Assignee: Samsung Display Co., Ltd., Yongin (KR)

( * ) Notice: Subject to any disclaimer, the term of this patent is extended or adjusted under 35 U.S.C. 154(b) by 147 days.

(21) Appl. No.: 13/226,446

(22) Filed: Sep. 6, 2011

(65) Prior Publication Data

US 2012/0187404 A1  Jul. 26, 2012

(30) Foreign Application Priority Data

Jan. 20, 2011  (KR) .................. 10-2011-0005962

(51) Int. Cl.
*H01L 29/786* (2006.01)

(52) U.S. Cl.
USPC  257/59; 257/72; 257/E29.273; 257/E21.409; 438/34; 438/36

(58) Field of Classification Search
USPC ......... 257/59, 72, E21.409, E29.273; 438/34, 438/66
See application file for complete search history.

(56) References Cited

U.S. PATENT DOCUMENTS

| 7,480,015 B2 | 1/2009 | Kim et al. |
| 2009/0201455 A1 | 8/2009 | Murai |

FOREIGN PATENT DOCUMENTS

| CN | 101479657 | 7/2009 |
| EP | 2071394 | 6/2009 |
| JP | 2007133410 | 5/2007 |
| KR | 1020030062643 | 7/2003 |
| KR | 1020040045113 | 6/2004 |
| KR | 1020040047311 | 6/2004 |
| KR | 1020040087069 | 10/2004 |
| KR | 1020050068465 | 7/2005 |
| KR | 1020070050612 | 5/2007 |
| KR | 1020090015951 | 2/2009 |
| KR | 1020090060756 | 6/2009 |
| KR | 1020100008565 | 1/2010 |
| WO | 2008038432 | 3/2008 |

*Primary Examiner* — Junghwa M Im

(74) *Attorney, Agent, or Firm* — H.C. Park & Associates, PLC

(57) ABSTRACT

Provided is a display device that includes: a gate line disposed on a substrate, the gate line including a protruding gate electrode; a data line extending across the gate line, the data line having first and second segments spaced apart from each other; a semiconductor pattern overlapping with the gate electrode; a drain electrode that contacts a drain region of the semiconductor pattern and connects the first and second segments; a source electrode that contacts a source region of the semiconductor pattern; and a storage electrode overlapping with the data line.

18 Claims, 8 Drawing Sheets

DISPLAY DEVICE AND METHOD OF FABRICATING THE SAME

CROSS-REFERENCE TO RELATED APPLICATION

This application claims priority from and the benefit of Korean Patent Application No. 10-2011-0005962, filed on Jan. 20, 2011, which is hereby incorporated by reference for all purposes as if fully set forth herein.

BACKGROUND

1. Field

The present disclosure relates to a display device and a method of fabricating the same.

2. Discussion of the Background

Display devices are have traditionally been used in televisions, computers, and the like, but have become widely used in small electronic devices, such as mobile phones and is personal digital assistants (PDA), because display devices have become light-weight, slim, and operate with lower power levels. Since display devices are used in various electronic devices and industrial fields, the demand for high reliability display devices is high.

SUMMARY

The present disclosure provides a display device having high reliability, and a method of fabricating the same.

The present disclosure also provides a display device having a high aperture ratio, and a method of fabricating the same.

The present disclosure also provides a display device having reduced process failure, and a method of fabricating the same.

Additional features of the invention will be set forth in the description which follows, and in part will be apparent from the description, or may be learned by practice of the invention.

Embodiments of the inventive concept provide a display device including: a plurality of pixels, each of the pixels includes a gate line disposed on a substrate and extending in a first direction, the gate line having a protruded gate electrode; a data line disposed on the substrate and extending in a second direction crossing the first direction, the data line having a first segment and a second segment spaced apart from each other; a semiconductor pattern overlapping with the gate electrode; a drain electrode that covers the semiconductor pattern, is disposed to one side of the gate electrode adjacent to the data line, and connects the first and second segments; a source electrode that covers the semiconductor pattern and is disposed at the other side of the gate electrode; and a storage electrode overlapping with the data line.

Aspects of the present inventive concept provide a method of fabricating a display device, the method including: forming a gate line extending in a first direction on a substrate, wherein the gate line includes a protruded gate electrode; forming a data line in a second direction on the substrate, wherein the data line includes first and second segments spaced apart from each other; forming a dielectric layer covering the gate line and the data line; forming a semiconductor pattern overlapping with the gate electrode; patterning the dielectric layer to form openings exposing ends of the first and second segments; forming a drain electrode that covers the semiconductor pattern, at one end of the gate electrode and in the openings; and forming a source electrode on the dielectric layer that covers the semiconductor pattern at the other end of the gate electrode; and forming a storage electrode overlapping with the data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

DETAILED DESCRIPTION OF THE EMBODIMENTS

Figure 1:
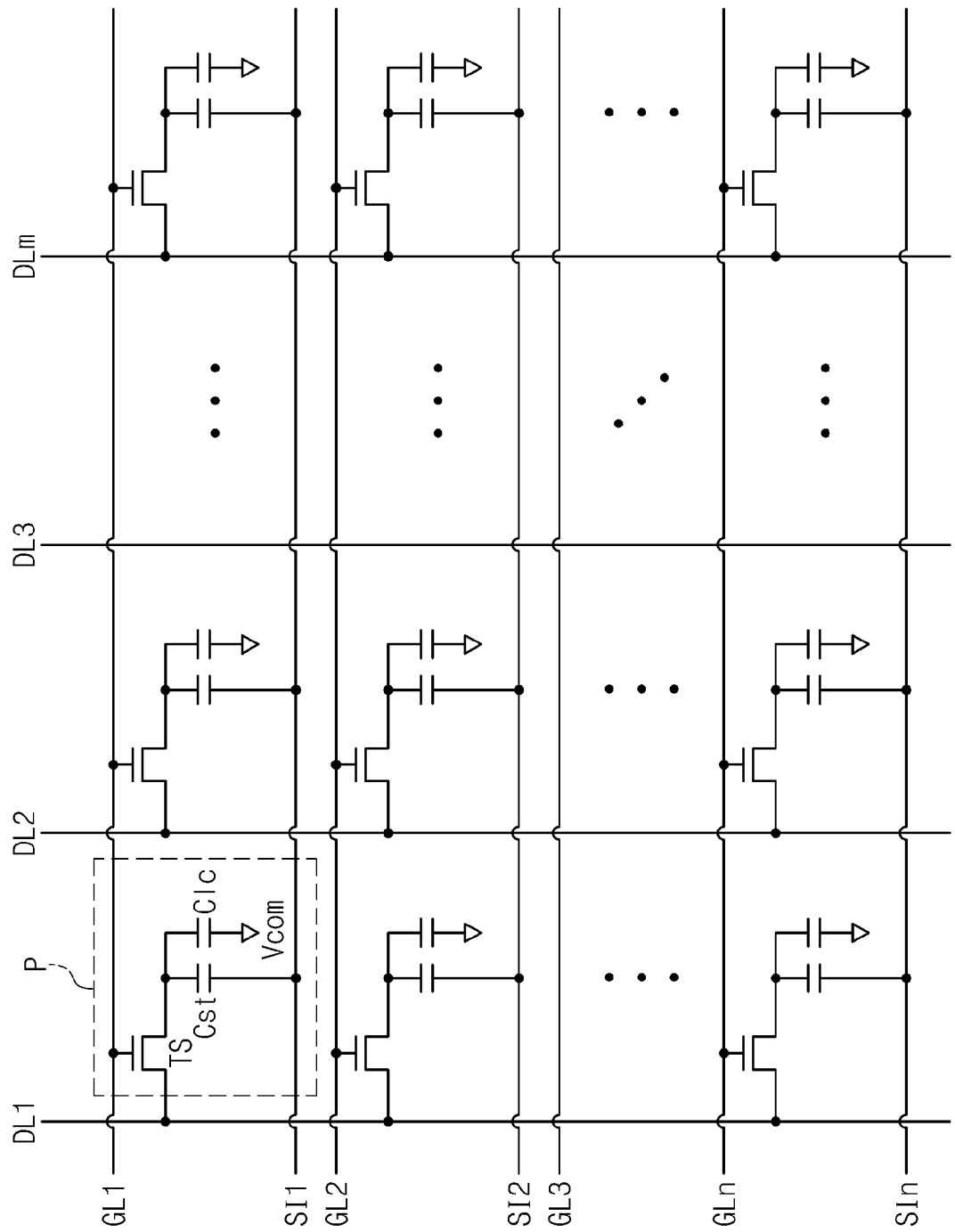
FIG. 1 is a circuit diagram illustrating a display device, according to an exemplary embodiment of the present inventive concept.

The above objects, other objects, features and advantages of the present invention will be better understood from the following description of exemplary embodiments, taken in conjunction with the accompanying drawings. The present invention may, however, be embodied in different forms and should not be construed as limited to the embodiments set forth herein. Rather, these exemplary embodiments are provided so that this disclosure will be thorough and complete, and will fully convey the scope of the present invention to those skilled in the art.

It will be understood that when an element or layer is referred to as being "on" or is "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

In the drawings, the dimensions of layers (or films) and regions are exaggerated for clarity of illustration. Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. As used herein, the term 'and/or' includes any and all combinations of one or more of the associated listed items. Like reference numerals refer to like elements throughout.

FIG. 1 is a circuit diagram illustrating a display device, according to an embodiment of the present inventive concept. Referring to FIG. 1, the display device includes a plurality of gate lines GL1 to GLn (n is an integer greater than 1), a plurality of data lines DL1 to DLm (m is an integer greater than 1), a plurality of pixels P, and a plurality of storage voltage interconnections SI1 to SIm. The gate lines GL1 to GLn may extend in parallel, in a first direction. The plurality of data lines DL1 to DLm may extend in parallel, in a second direction. The second direction crosses the first direction. The second direction may be substantially perpendicular to the first direction.

Each of the pixels P may be connected to one gate line and one data line. The pixels P are arranged in rows extending in the first direction and columns extending in the is second direction. Pixels P included in the same row may be connected to the same gate line, and pixels P included in the same column may be connected to the same data line. The gate lines GL1 to GLn may extend between adjacent rows, and the data lines DL1 to DLm may extend between adjacent columns.

Each of the pixels P may include a switching transistor TS, a storage capacitor Cst, and a liquid crystal capacitor Clc. In the switching transistor TS, for example, a control terminal is connected to the gate line GL1, and an input terminal may be connected to the data line DL1. An output terminal of the switching transistor TS may be connected to one end (first end) of the liquid crystal capacitor Clc and one end of the storage capacitor Cst. Common voltage Vcom may be applied to the other end (second end) of the liquid crystal capacitor Clc.

The second end of the storage capacitor Cst may be connected to the storage voltage interconnection SI1. The storage voltage interconnection SI1 may transfer storage voltage to the second end of the storage capacitor Cst. According to an exemplary embodiment, the magnitude of the storage voltage may be the same as that of the common voltage Vcom. In this case, the second end of the liquid crystal capacitor Clc may be connected to the storage voltage interconnection SI1.

A gate voltage may be sequentially applied to the gate lines GL1 to GLn. As such, the switching transistor TS included in the pixels P connected to the gate line to which the gate voltage is applied, may be turned on. The switching transistor TS included in the pixels P connected to the gate lines to which the gate voltage is not applied, may be turned off. Switching transistors TS included in the pixels P connected to the same gate line may be turned on or turned off at the same time, or individually.

The data lines DL1 to DLm may transfer data output voltage to the input terminal is of the pixels P. The data output voltage may be stored between the storage capacitor Cst and the liquid crystal capacitor Clc, and transferred to the output terminals of the pixels P. A liquid crystal layer may be driven by a difference between the data output voltage applied to the liquid crystal capacitor Clc and the common voltage Vcom. Therefore, gray-scale values of the pixels P can be controlled.

A display device, according to an exemplary embodiment of the present disclosure, may include a thin film transistor substrate, a color filter substrate, and a liquid crystal layer disposed between the color filter and thin film transistor substrates. The color filter substrate may include a common electrode, to which the common voltage Vcom is applied, and a color filter.

The thin film transistor substrate may include the gate lines GL1 to GLn, the data lines DL1 to DLm, the storage voltage interconnections SI1 to SIm, the switching transistor TS, and the storage capacitor Cst. The storage voltage interconnections SI1 to SIm may include a portion overlapped with the data lines DL1 to DLm. This will be described with reference to FIGS. 2A and 2B.

Figure 2A:
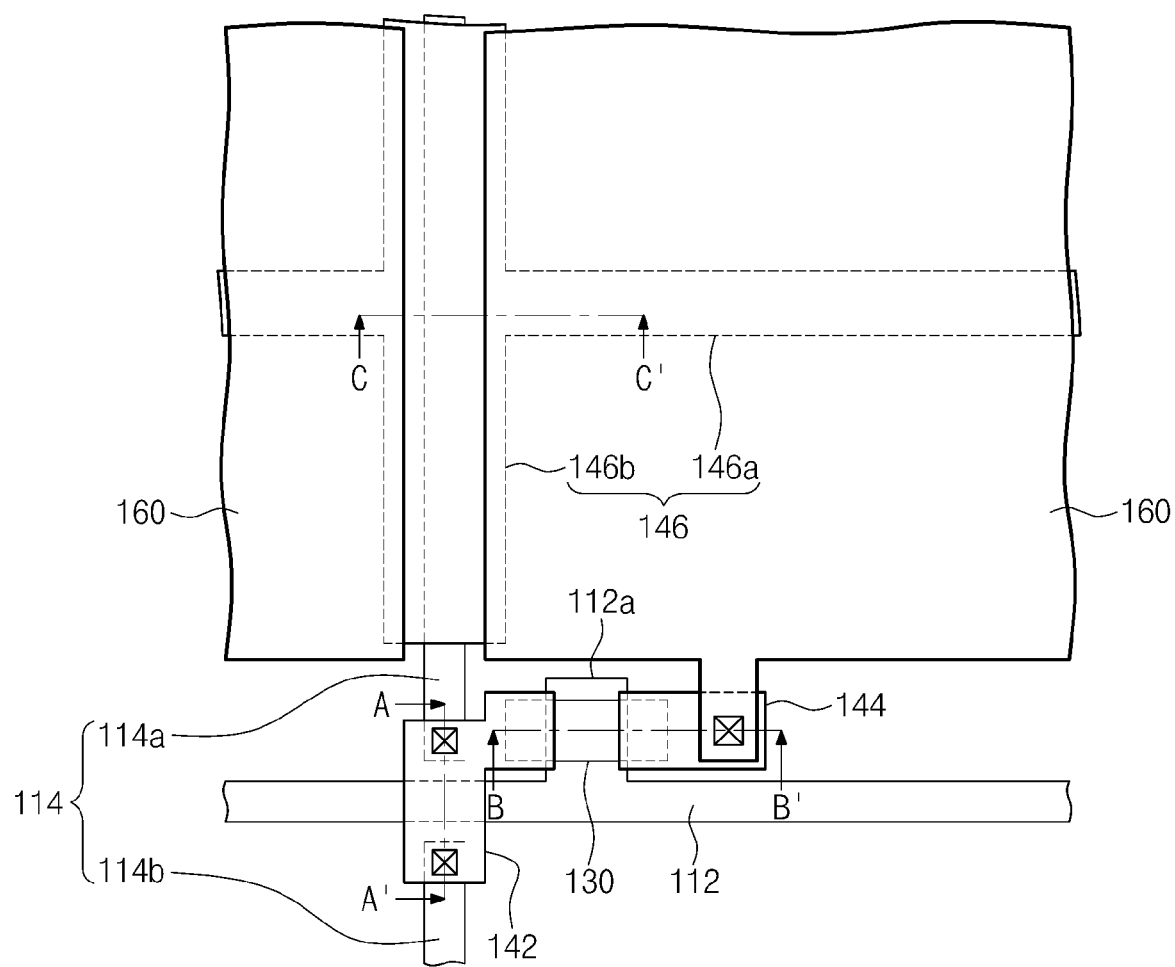
FIG. 2A is a plan view illustrating a thin film transistor substrate included in a display device, according to an exemplary embodiment of the present inventive concept.
Figure 2B:
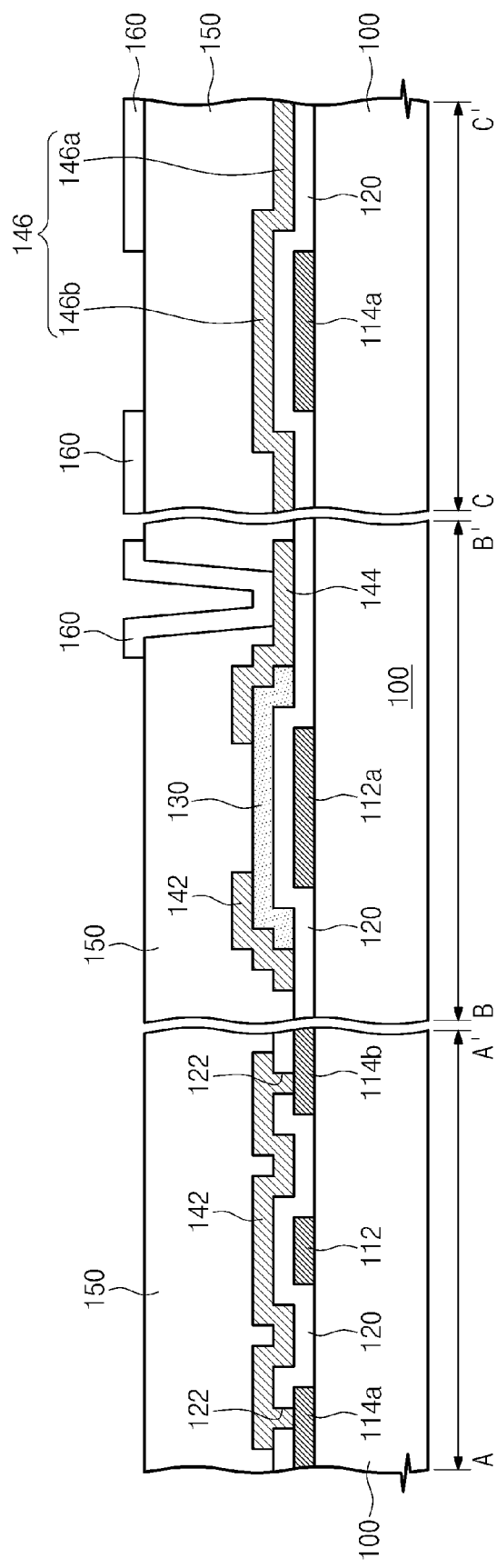
FIG. 2B is a cross-sectional view taken along the A-A', B-B' and C-C' of FIG. 2A for illustrating a thin film transistor substrate included in a display device, according to an exemplary embodiment of the present inventive concept.

FIG. 2A is a plan view illustrating the thin film transistor substrate included in a display device, according to an exemplary embodiment of the present inventive concept. FIG. 2B is a cross-sectional view taken along the lines A-A', B-B', and C-C' of FIG. 2A.

Referring to FIGS. 2A and 2B, a gate line 112 and a data line 114 may be disposed on a substrate 100. The gate line 112 may extend in a first direction. The data line 114 may extend in a second direction crossing the first direction, so as to form pixel regions. The gate line 112 and the data line 114 may be provided in the same process. The gate line 112 and the data line 114 may be formed of the same material. The lower surface of the gate line 112 and is the lower surface of the data line 114 may directly contact the upper surface of the substrate 100. The gate line 112 may be one of the gate lines GL1 to GLn described with reference to FIG. 1, and the data line 114 may be one of the data lines DL1 to DLm described with reference to FIG. 1.

The data line 114 includes a first segment 114a and a second segment 114b. The first segment 114a and the second segment 114b may extend in the second direction. The first segment 114a and the second segment 114b may be spaced apart from each other in the second direction. According to an exemplary embodiment, the first segment 114a and the second segment 114b may extend along the same virtual extension line. The gate line 112 may extend between the first segment 114a and the second segment 114b.

A first dielectric layer 120 covers the gate line 112 and the data line 114. The first dielectric layer 120 may include at least one of a silicon oxide layer, a silicon nitride layer, and a silicon oxynitride layer.

A semiconductor pattern 130 is disposed on the first dielectric layer 120. The semiconductor pattern 130 is overlapped with a gate electrode 112a. The gate electrode 112a is a portion of the gate line 112 that extends in the second direction. The semiconductor pattern 130 may include amorphous silicon or crystalline silicon.

A source electrode 144 and a drain electrode 142 are disposed on the first dielectric layer 120, so as to cover source and drain regions of the semiconductor pattern 130, which are disposed at opposing sides of the gate electrode 112a. The drain electrode 142 may cover a region of the semiconductor pattern 130 corresponding to a first side of the gate electrode 112a that is adjacent to the data line 114. The source electrode 144 may cover a region of the semiconductor pattern 130 corresponding to an opposing second side of the gate electrode 112a.

The drain electrode 142 may fill openings 122 that expose adjacent ends of the first segment 114a and the second segment 114b. Therefore, the first segment 114a and the second segment 114b may be electrically connected to each other by the drain electrode 142. The portion of the first dielectric layer 120 between the gate electrode 112a and the semiconductor pattern 130 may be referred to as a gate dielectric layer.

A storage electrode 146 is disposed on the first dielectric layer 120. The storage electrode 146 includes a first part 146a and a second part 146b. The first part 146a extends in the first direction. The second part 146b extends in the second direction. The second part 146b extends from the first part 146a, into a pixel region of the substrate. In a plane view, the first part 146a is spaced apart from the gate line 112. Therefore, the first part 146a and the gate line 112 may not overlap. The second part 146b may be overlapped with the data line 114. The width of the first part 146a may be greater than that of the second part 146b. The width of the first part 146a may be greater than the width of the data line 114.

The storage electrode 146 is positioned at a higher level than the gate line 112 and the data line 114, with respect to the upper surface of the substrate 100. The storage electrode 146 may ones of the storage voltage interconnections SI1 to SIn described with reference to FIG. 1.

The storage electrode 146, the source electrode 144, and the drain electrode 142 may be formed using the same mask process. The storage electrode 146, the source electrode 144, and the drain electrode 142 may be formed of the same material. The storage electrode 146, the source electrode 144, and the drain electrode 142 may include a transparent conductive material. The transparent conductive material may include at least one of indium tin oxide (ITO), indium zinc oxide (IZO), zinc oxide (ZnO$_2$), and indium gallium zinc oxide (IGZO). Therefore, a display panel with increased aperture ratio can be provided. Alternatively, the storage electrode 146, the source electrode 144, and the drain electrode 142 may be formed of an opaque conductive material.

A second dielectric layer 150 is disposed so as to cover the source and drain electrodes 144 and 142 and the storage electrode 146. The second dielectric layer 150 may be inorganic or organic dielectric layer.

A pixel electrode 160 is disposed on the second dielectric layer 150 in the pixel region. The pixel electrode 160 penetrates the second dielectric layer 150, so as to be connected to the source electrode 144. The pixel electrode 160 may include a transparent conductive material.

The gate electrode 112a, the semiconductor pattern 130, the source and drain electrodes 144 and 142, and the gate dielectric layer may be referred to as the switching transistor TS described with reference to FIG. 1. The first part 146a of the storage electrode 146, the pixel electrode 160, and a storage capacitor dielectric layer may be referred to as the storage capacitor Cst described with reference to FIG. 1. The storage capacitor dielectric layer may be referred to as the second dielectric layer 150, between the first part 146a and the pixel electrode 160.

The storage electrode 146 covers the data line 114. As a result, a parasitic capacitance between the pixel electrode 160 and the data line 114 may be minimized by the storage electrode 146. Therefore, a highly reliable display device can be achieved.

As described above, the parasitic capacitance between the pixel electrode 160 and the data line 114 is minimized by the storage electrode 146 overlapping with the data line 114, so that an organic layer between the pixel electrode 160 and the data line 114 may be omitted. Therefore, the fabrication yield of a thin film transistor substrate can be improved, by reducing the failure rate of the thin film transistor substrate during the formation of an organic layer.

Figure 3:
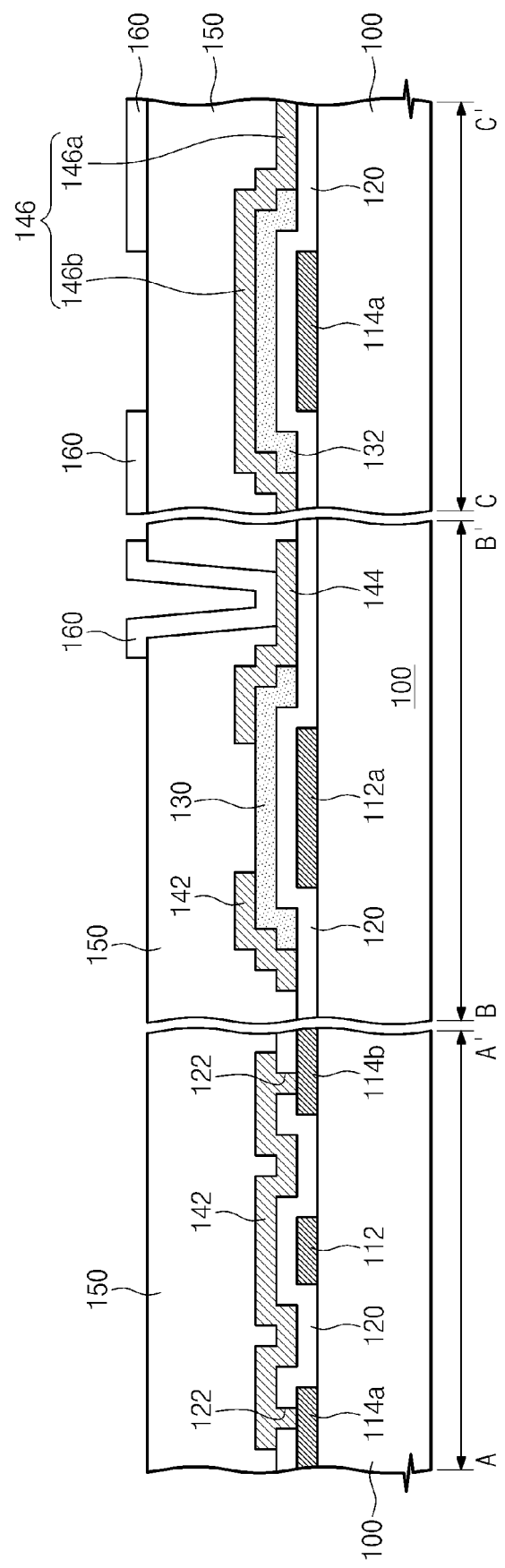
FIG. 3 is a cross-sectional view illustrating a thin film transistor substrate included in a display device, according to an exemplary embodiment of the present inventive concept.

FIG. 3 is a cross-sectional view taken along the lines A-A', B-B', and C-C' of FIG. 2A, and illustrates a thin film transistor substrate included in a display panel, according to an exemplary embodiment of the present inventive concept. The display panel is a modification of the display described with reference to FIGS. 2A and 2B. Thus, only the differences there between will be mainly described.

Referring to FIG. 3, a dummy pattern 132 is disposed between a second part 146b of a storage electrode 146 and a first dielectric layer 120. The dummy pattern 132 and the semiconductor pattern 130 may be formed using the same process. The dummy pattern 132 may include the same material as the semiconductor pattern 130.

The storage electrode 146 is disposed adjacent to the pixel electrode 160 and the dummy pattern 132. Therefore, the parasitic capacitance between the pixel electrode 160 and the data line 114 may be decreased.

Figure 4A:
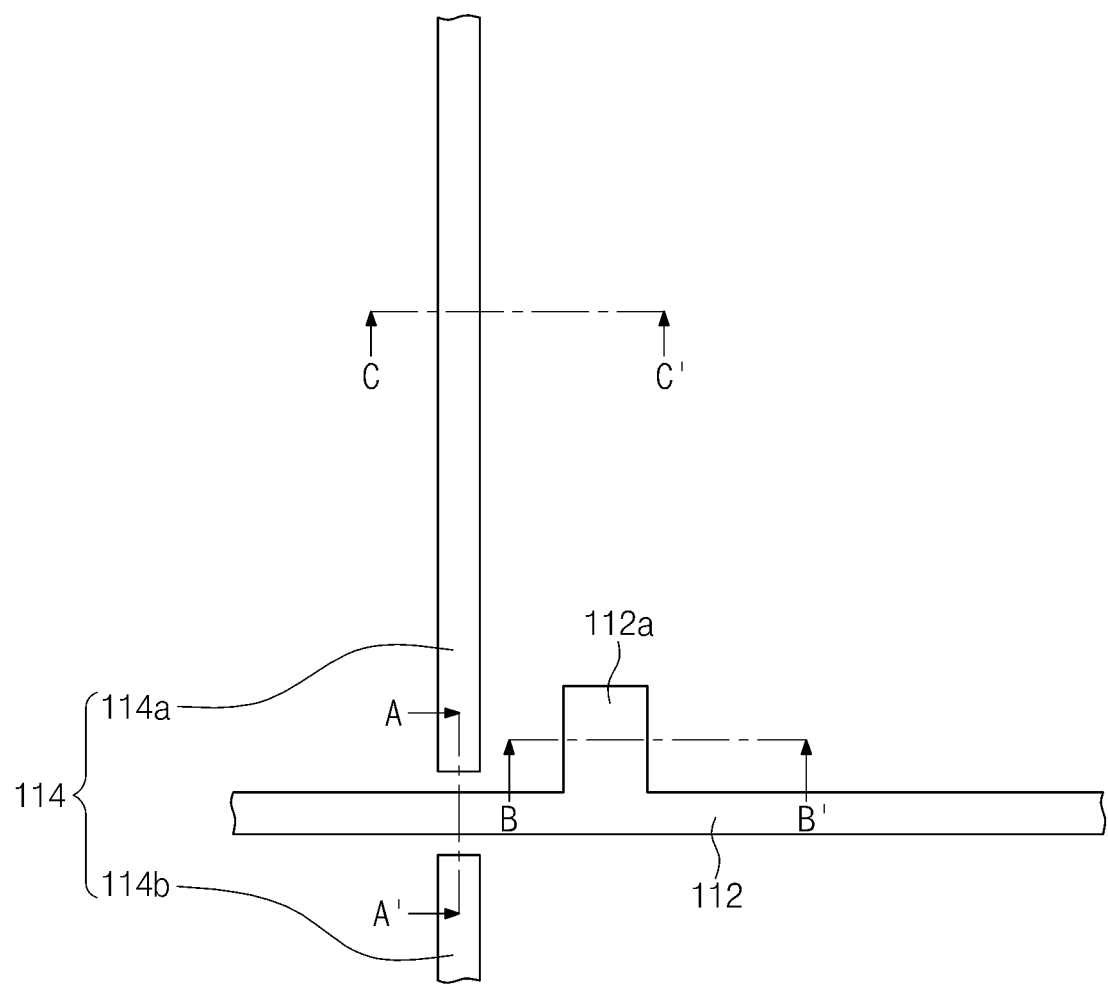
FIGS. 4A and 5A are plan views illustrating a fabricating method of a thin film transistor substrate included in a display device, according to an exemplary embodiment of the present inventive concept.
Figure 4B:
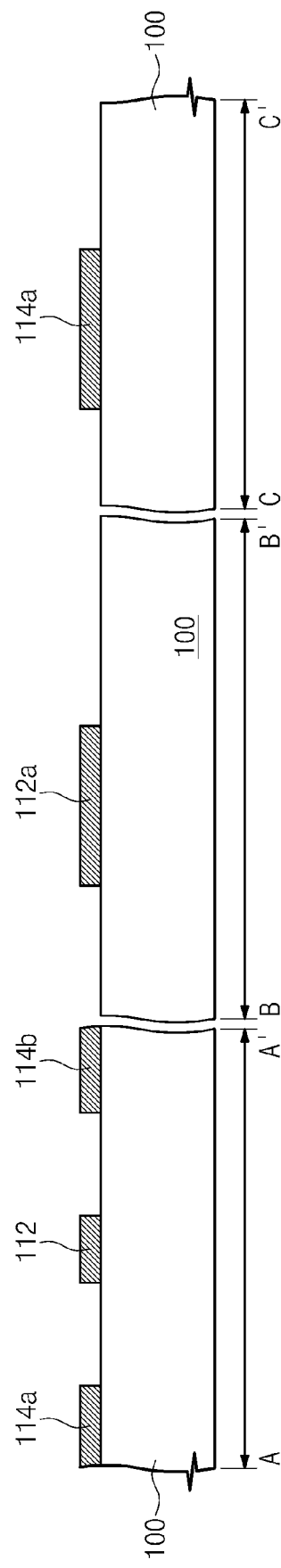
FIGS. 4B and 5B are cross-sectional views taken along the lines A-A', B-B' and C-C' of FIGS. 4A and 5A, respectively, for illustrating a fabricating method of a thin film transistor substrate included in a display device, according to an exemplary embodiment of the present inventive concept.
Figure 5A:
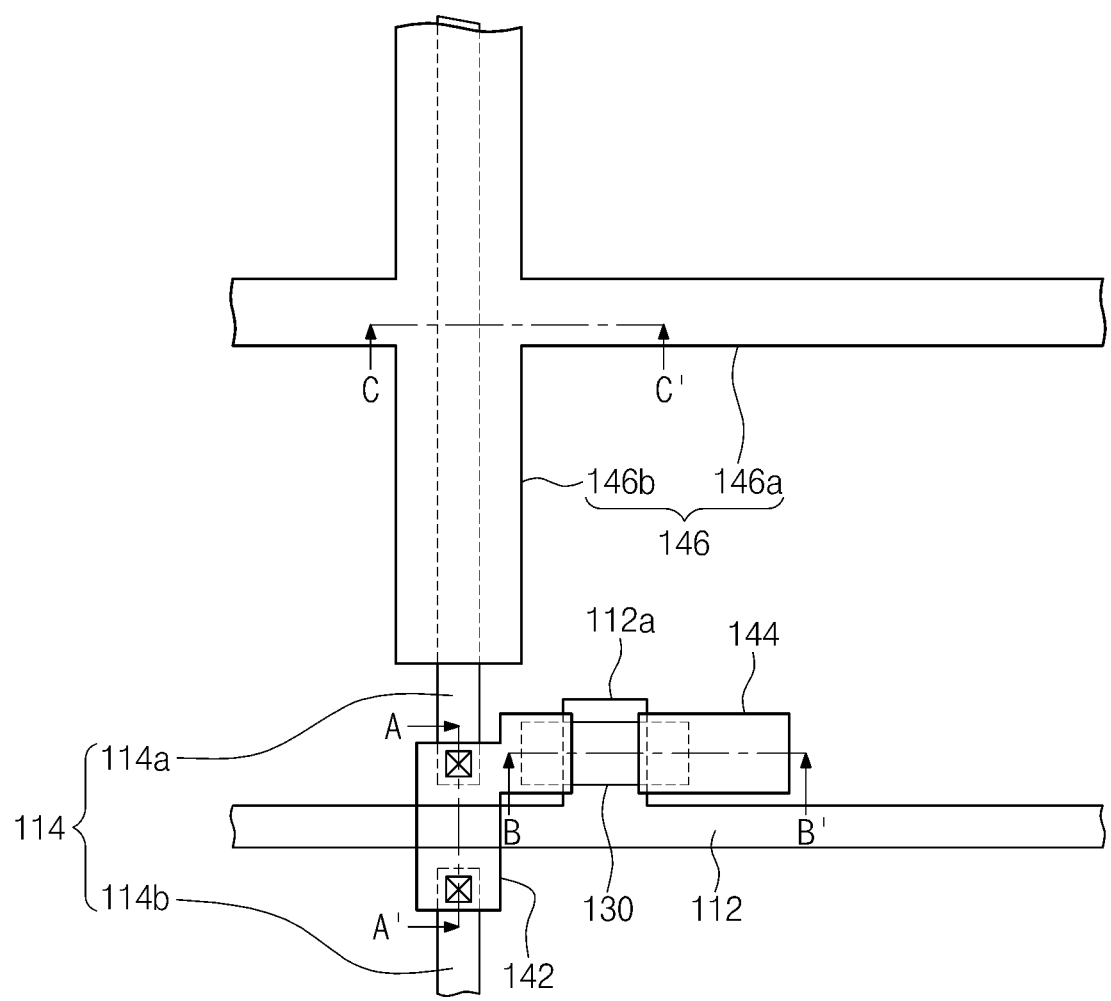
Figure 5B:
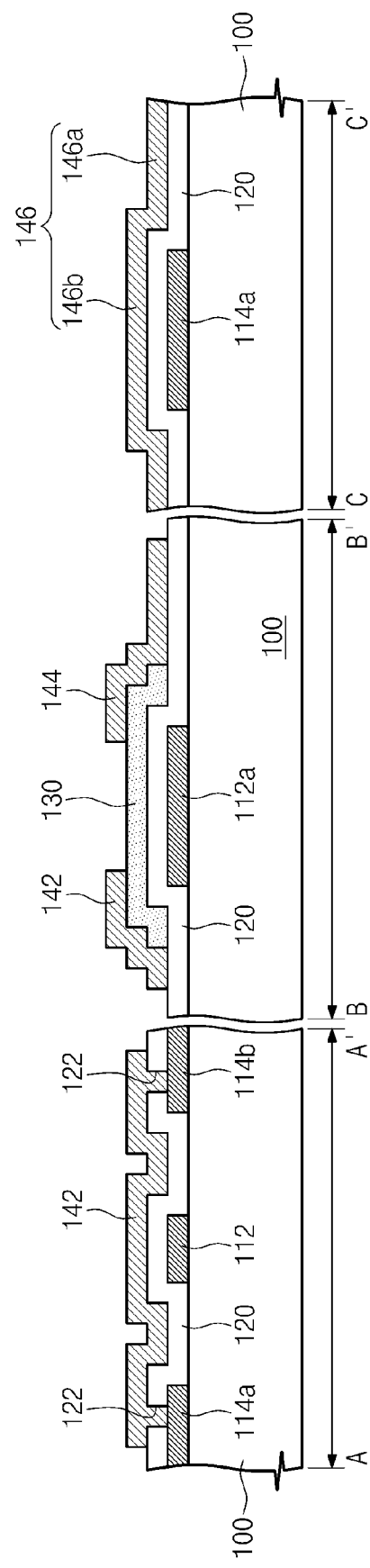

FIGS. 4A and 5A are plan views illustrating a method of fabricating a thin film transistor substrate included in a display panel, according to an exemplary embodiment of the present inventive concept. FIGS. 4B and 5B are cross-sectional views taken along the lines A-A', B-B' and C-C' of FIGS. 4A and 5A, respectively.

Referring to FIGS. 4A and 4B, a gate line 112 and a data line 114 are formed on a substrate 100 and are spaced apart from each other. The gate line 112 and the data line 114 may be formed using the same mask process. For example, a first conductive layer is formed on the substrate 100, and then the gate line 112 and the data line 114 may be formed by patterning the first conductive layer. For example, the first conductive layer may include at least one of is molybdenum (Mo), aluminum (Al), niobium (Nb), silver (Ag), copper (Cu), chromium (Cr), titanium (Ti), and tantalum (Ta).

The gate line 112 may extend in a first direction. The gate line 112 may include a protruding gate electrode 112a. The gate electrode 112a may protrude in a direction crossing the first direction.

The data line 114 may extend in a second direction. The second direction may cross the first direction. The data line 114 may include a first segment 114a and a second segment 114b. The first segment 114a and the second segment 114b may be spaced apart in the second direction. The gate line 112 may extend between the first segment 114a and the second segment 114b.

Referring to FIGS. 5A and 5B, a first dielectric layer 120 covering the gate line 112 and the data line 114 are formed. A semiconductor pattern 130 overlapping with the gate electrode 112a is formed on the first dielectric layer 120. The semiconductor pattern 130 may be formed of polycrystalline silicon that is formed by crystallizing an amorphous silicon substrate. In this case, the crystallization process may be a heat treatment process. For example, the heat treatment process may be any one of an excimer laser annealing (ELA) process, a sequential lateral solidification (SLS) process, and a super grain silicon (SGS) process.

Openings 122 that expose ends of the first segment 114a and the second segment 114b are formed by patterning the first dielectric layer 120. The exposed ends of the first segment 114a and second segment 114b may be adjacent to each other.

A drain electrode 142, a source electrode 144, and a storage electrode 146 are formed. The drain electrode 142, the source electrode 144, and the storage electrode 146 may be formed using the same mask process. For example, a second conductive layer and a mask are is formed on the first dielectric layer 120, and then the drain electrode 142, the source electrode 144, and the storage electrode 146 may be formed by patterning the second conductive layer. The second conductive layer fills the openings 122.

According to an exemplary embodiment, the second conductive layer may include a transparent conductive material. According to another embodiment, the second conductive layer may include an opaque conductive material. In this case, for example, the second conductive layer may include at least one of molybdenum (Mo), aluminum (Al), tungsten (W), vanadium (V), chromium (Cr), tantalum (Ta), and titanium (Ti).

The source and drain electrodes 144 and 142 may cover source and drain regions of the semiconductor pattern 130, at opposing sides of the gate electrode 112a. The drain electrode 144 may electrically connect the first segment 114a and the second segment 114b, via the opening 122.

The storage electrode 146 includes a first part 146a and a second part 146b. The first part 146a extends in the first direction. The second part 146b extends in the second direction. The second part 146b is overlapped with the data line 114.

Referring to FIGS. 2A and 2B, a second dielectric layer 150 is formed so as to cover the source and drain electrodes 144 and 142 and the storage electrode 146. An opening exposing the source electrode 144 is formed by patterning the second dielectric layer 150. A pixel electrode 160 filling the opening is formed on the second dielectric layer 150. The pixel electrode 160 may include a transparent conductive layer.

A display device, according to an exemplary embodiment of the present inventive concept, includes a gate line disposed on a substrate and extending in a first direction, and a data line disposed on the substrate and extending in a second direction crossing the first direction. The data line includes first and second segments spaced apart from each other. A drain electrode connects the first and second segments, and a storage electrode is overlapped with the data line. Therefore, a display device having high reliability and high aperture ratio can be provided.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A display device comprising:
    a substrate having pixel regions;
    gate lines disposed on the substrate and extending between the pixel regions, the gate lines comprising protruding gate electrodes;
    data lines crossing the gate lines and extending between the pixel regions, the data lines comprising first segments and second segments that are spaced apart from each other;
    a storage electrode overlapping with the data lines;
    wherein each of the pixel regions comprises:
        a semiconductor pattern overlapping with one of the gate electrodes;
        a drain electrode that contacts a drain region of the semiconductor pattern and connects adjacent ones of the first and second segments; and
        a source electrode that contacts a source region of the semiconductor pattern.

2. The display device of claim 1, wherein the storage electrode is disposed above the gate lines and the data lines, with respect to the substrate.

3. The display device of claim 2, wherein the data line and the gate line are disposed directly on the substrate.

4. The display device of claim 1, wherein the storage electrode comprises:
    first parts extending substantially parallel to the gate lines; and
    second parts extending substantially parallel to the data lines.

5. The display device of claim 4, wherein the second parts are overlapped with the data lines.

6. The display device of claim 4, wherein the second parts are wider than the data lines.

7. The display device of claim 1, wherein the gate lines extend between the first segments and the second segments.

8. The display device of claim 1, further comprising a dielectric layer that covers the gate lines and the data lines, wherein the drain electrodes are disposed on the dielectric layer and penetrate the dielectric layer to connect the first segments and the second segments.

9. The display device of claim 8, wherein the storage electrodes are disposed on the dielectric layer and cover the data lines.

10. The display device of claim 1, wherein the storage electrode, the source electrodes, and the drain electrodes comprise a transparent conductive material.

11. A method of fabricating a display device, the method comprising:
    forming a gate line on a substrate, the gate line comprising a protruding gate electrode;
    forming a data line across the gate line, the data line comprising a first segment and a separate second segment;
    forming a dielectric layer on the gate line and the data line;
    forming a semiconductor pattern on the gate electrode;
    patterning the dielectric layer to form openings exposing ends of the first segment and the second segment;
    forming a drain electrode on a drain region of the semiconductor pattern, the drain electrode connecting the first and second segments through the openings formed in the dielectric layer;
    forming a source electrode on a source region of the semiconductor pattern; and
    forming a storage electrode on the data line.

12. The method of claim 11, wherein a common mask process is used to form the drain electrode, the source electrode, and the storage electrode.

13. The method of claim 11, wherein a common mask process is used to form the gate line and the data line.

14. The method of claim 11, wherein the dielectric layer is formed between the semiconductor pattern and the gate electrode.

15. A display device comprising:
    a substrate comprising pixel regions;
    data lines disposed on the substrate and extending between the pixel regions, the data lines comprising first segments and second segments;
    gate lines extending between the pixel regions and through gaps formed between the first segments and the second segments, the gate lines comprising gate electrodes that extend toward the pixel regions;
    a first dielectric layer disposed on the data lines and the gate lines;
    semiconductor patterns disposed on first dielectric layer facing the gate electrodes;
    drain electrodes disposed on drain regions of the semiconductor patterns and connecting adjacent ones of the first and second segments;
    source electrodes disposed on source regions of the semiconductor patterns; and
    pixel electrodes disposed in the pixel regions and connected to the source electrodes.

16. The display device of claim 15, further comprising:
    a storage electrode disposed on the first dielectric layer; and a second dielectric layer disposed between the pixel electrodes and the storage electrode.

17. The display device of claim 16, wherein the storage electrode comprises:

first parts that face the data lines; and second parts that extend from the first portions across the pixel regions.

18. The display device of claim 17, wherein the second parts are wider than the data lines.

* * * * *